US009055707B2

(12) United States Patent
Lai

(10) Patent No.: US 9,055,707 B2
(45) Date of Patent: Jun. 9, 2015

(54) DIE BOND SYSTEM

(71) Applicant: HON HAI PRECISION INDUSTRY CO., LTD., New Taipei (TW)

(72) Inventor: Chih-Chen Lai, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 183 days.

(21) Appl. No.: 13/719,240

(22) Filed: Dec. 19, 2012

(65) Prior Publication Data

US 2013/0232775 A1  Sep. 12, 2013

(51) Int. Cl.
*B23P 19/00* (2006.01)
*H05K 13/04* (2006.01)
*H01L 21/67* (2006.01)
*H01L 21/683* (2006.01)

(52) U.S. Cl.
CPC ........... *H05K 13/04* (2013.01); *Y10T 29/53087* (2015.01); *Y10T 29/53261* (2015.01); *Y10T 29/53174* (2015.01); *Y10T 29/53178* (2015.01); *Y10T 29/53183* (2015.01); *Y10T 29/53* (2015.01); *Y10T 29/53191* (2015.01); *H01L 21/67144* (2013.01); *H01L 21/67259* (2013.01); *H01L 21/6838* (2013.01)

(58) Field of Classification Search
CPC .. H05K 13/04; Y10T 29/53087; Y10T 29/53; Y10T 29/53174; Y10T 29/53178; Y10T 29/53183; Y10T 29/53191; H01L 21/67144; H01L 21/67259; H01L 21/6838
USPC ........... 29/720, 700, 739, 740, 741, 743, 729, 29/759, 760
See application file for complete search history.

(56) References Cited

U.S. PATENT DOCUMENTS

| 6,076,912 | A  | * | 6/2000 | Murthy | 347/18 |
| 6,898,848 | B2 | * | 5/2005 | Ohkubo et al. | 29/840 |
| 6,959,485 | B2 | * | 11/2005 | Isa | 29/709 |
| 7,246,430 | B2 | * | 7/2007 | Yonezawa et al. | 29/740 |
| 7,587,814 | B2 | * | 9/2009 | Suhara | 29/740 |
| 8,773,159 | B2 | * | 7/2014 | Murakami et al. | 324/763.01 |

* cited by examiner

*Primary Examiner* — Peter DungBa Vo
*Assistant Examiner* — Azm Parvez
(74) *Attorney, Agent, or Firm* — Novak Druce Connolly Bove + Quigg LLP

(57) ABSTRACT

A die bonding system for bonding a die on a substrate is provided. The die bonding system includes a supporting base for the substrate, a die pickup device for picking up the die, and an alerting device. The supporting base includes a number of conductive and height-adjustable upper portions. The upper portions are spaced from each other. The alerting device includes a power source and an alerting element electrically connected to the power source. Two electrodes of the power source are electrically connected to the die pickup device and the upper portions, and the alerting element generates different alerts according to different contacting status of the upper portions and the die pickup device.

19 Claims, 2 Drawing Sheets

DIE BOND SYSTEM

BACKGROUND

1. Technical Field

The present disclosure relates to die bond systems and, particularly, to a die bond system for bonding a die on a substrate.

2. Description of Related Art

A die bond system includes a supporting base and a die pickup device. In operation, a substrate is supported on the base. The die pickup device picks up a die from a wafer and places the die at a predetermined position of the substrate.

In a die bonding process, if the planar correspondence between the substrate and the die is beyond a certain tolerance, the die may not contact the substrate sufficiently, or there may be gaps in the contact. The bonding between the substrate and the die may be incomplete or decreased, and/or the stress in the die will be increased. Therefore, the die bonding quality must be assured. To ensure corresponding or matching planarity between the substrate and the die in the die bonding process, the orientation of the die pickup device in relation to the supporting base should be adjusted beforehand. However, the process for adjusting the orientation is carried out manually in related art, it is inefficient and inaccurate.

What is needed therefore is die bond system addressing the limitations described.

BRIEF DESCRIPTION OF THE DRAWINGS

The components of the drawings are not necessarily drawn to scale, the emphasis instead being placed upon clearly illustrating the principles of the embodiments of the present disclosure. Moreover, in the drawings, like reference numerals designate corresponding parts throughout several views.

DETAILED DESCRIPTION

Figure 1:
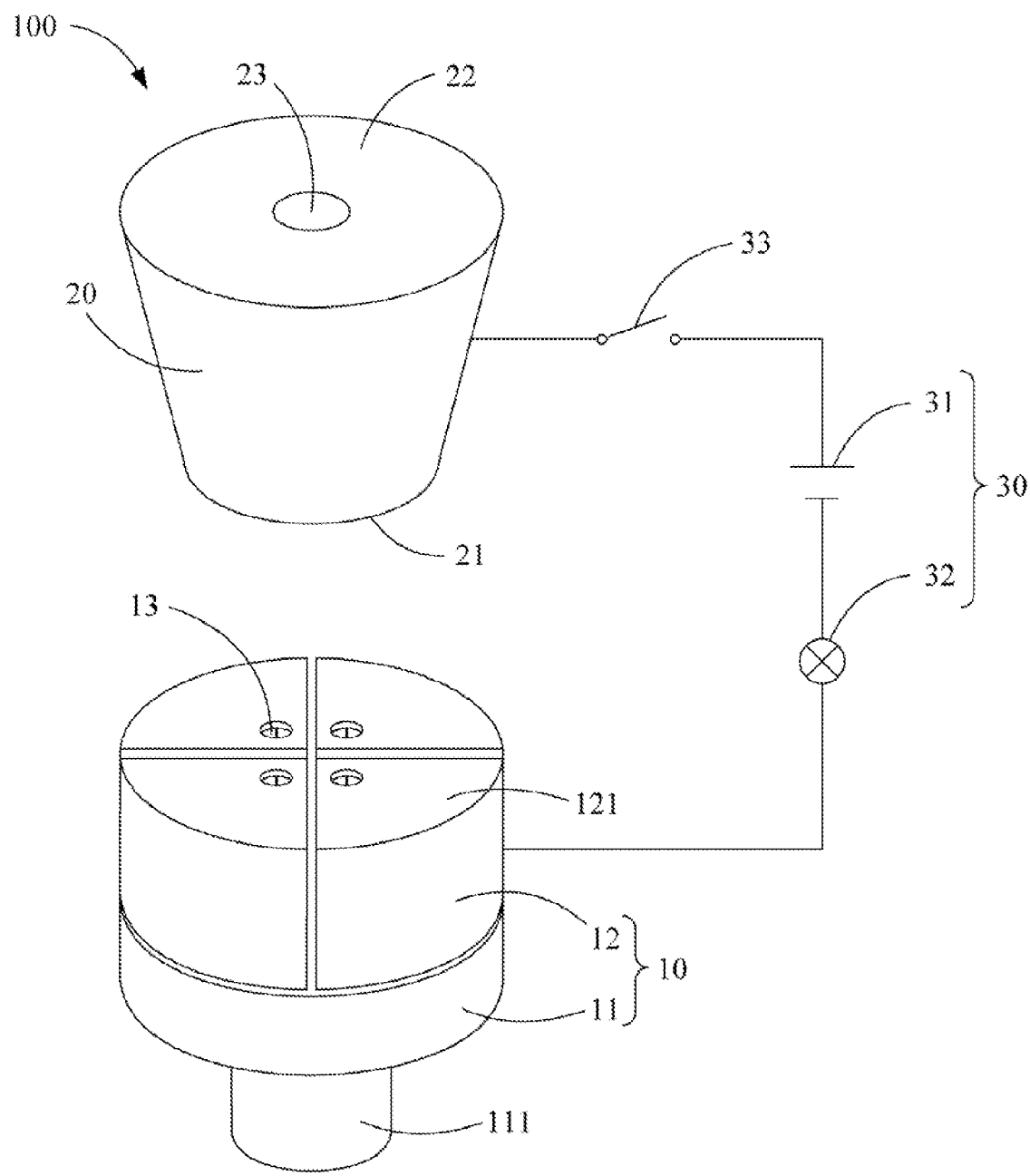
FIG. 1 is a schematic view of a die bond system, according to an exemplary embodiment of the present disclosure.
Figure 2:
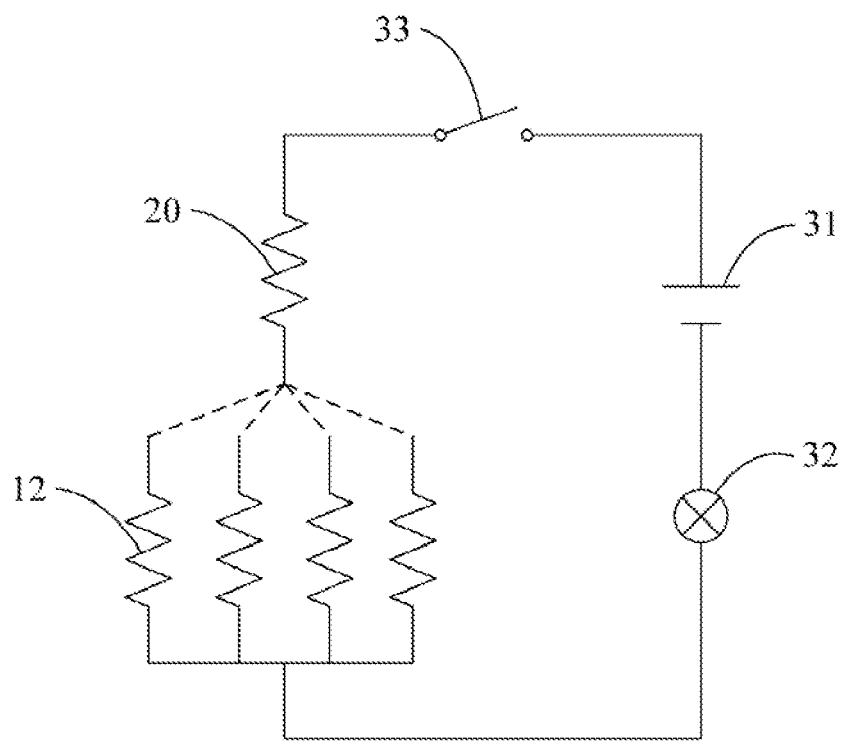
FIG. 2 is a circuit diagram within the die bonding system of FIG. 1.

Referring to FIGS. 1-2, a die bond system 100, according to an exemplary embodiment, is shown. The die bond system 100 includes a supporting base 10, a die pickup device 20, and an alerting device 30.

The supporting base 10 supports and positions a substrate (not shown) to be bonded with a die. The supporting base 10 includes a bottom portion 11 and a number of upper portions 12 supported on the bottom portion 11. The bottom portion 11 includes a rotating shaft 111. The rotating shaft 111 is connected to and rotated by a motor (not shown). The bottom portion 11 can thus be rotated. The upper portions 12 are spaced from each other, and a height of each upper portion 12 in relation to the bottom portion 111 can be adjusted. In this embodiment, the height of each upper portion 12 can be adjusted by means of a screw 13 for example. Each upper portion 12 includes a top surface 121 facing away from the bottom portion 11. In this embodiment, each upper portion 12 is substantially a block of material with a fan-shaped cross-section. The top surfaces 121 of the upper portions 12 form a substantially circular supporting surface of the supporting base 10. The number of the upper portions 12 can be changed to any number greater than three, according to different demands. In this embodiment, the number of the upper portions 12 is four. The upper portions 12 are made from conductive material(s), and each upper portion 12 has a different electrical resistance. Further, the electrical resistance of any two upper portions 12 connected in parallel is different from the electrical resistance of anyone of the other upper portions 12 or any two or more of the other upper portions 12 connected in parallel.

The die pickup device 20 picks up a die (not shown) from a wafer (not shown) and puts the die in a predetermined position on the substrate. The die pickup device 20 is a vacuum suction nozzle. The die pickup device 20 includes a suction end 21, a connecting end 22 opposite to the suction end 21, and a pumping hole 23 passing through the suction end 21 and the connecting end 22. The suction end 21 can pickup the die by creating a vacuum. The connecting end 22 is connected to a manipulator to automatically move the die from the wafer to the substrate. The die pickup device 20 is made from a conductive material(s). In this embodiment, the die pickup device 20 is made from tungsten steel.

The alerting device 30 includes a power source 31 and an alerting element 32 electrically connected to the power source 31. One electrode of the power source 31 is connected to the die pickup device 20 and the other electrode is connected to all the upper portions 12. The alerting element 31, the die pickup device 20, and any one of the four upper portions 12 are connected in series, the upper portions 12 are connected to each other in parallel. The alerting element 32 provides a visible alert as to a contacting status between the die pickup device 20 and the upper portions 12. In detail, the alerting element 32 gives alerts according to currents passing. In this embodiment, the alerting element 32 is a buzzer that generates different beeps for currents with different intensities. Alternatively, the alerting element 32 can be other type of device that shows alerts according to a current, such as a light emitting diode (LED). The alerting device 30 further includes a switch unit 33 for turning on/off an alerting function of the alerting element 32. In this embodiment, the switch unit 33 is connected between the power source 31 and the die pickup device 20.

Before a die bonding process, an orientation between the die pickup device 20 and the upper portions 12 require adjustment to ensure bonding quality. In the adjusting process, the switch unit 30 is turned off and, the die pickup device 20 is moved toward the upper portions 12 until the suction end 21 contacts at least one of the top surfaces 121 of the upper portions 12. When the die pickup device 20 contacts the upper portions 12, the switch unit 30 is turned on, and the alerting element 32 generates an alert to represent a contact status between the die pickup device 20 and the upper portions 12. If the suction end 21 of the die pickup device 20 is in contact with all of the top surfaces 121 of the upper portions 12, the electrical resistance of a circuit consisting of the alerting device 30, the die pickup device 40 and all of the upper portions 12 is the lowest, and thus the alerting element 32 generates a first alert representing that the suction end 21 of the die pickup device 20 is contacting all of the top surfaces 121 of the upper portions 12. If the suction end 21 of the die pickup device 20 does not contact all of the top surfaces 121 of the upper portions 12, the resistance of the circuit increases, the alerting element 32 generates a different alert representing the appropriate contact status of the suction end 21 of the die pickup device 20 and the top surfaces 121 of the upper portions 12. Because each upper portion 12 has a resistance different from the others, and the electrical resistance of any two upper portions 12 connected in parallel is different from the electrical resistance of any other upper portions 12 or any other upper portions 12 connected in parallel, the contact status can be determined from the particular alert which is given, further, the one or more upper portions 12 which is not in contact with the suction end 21 of the die pickup device 20 can be determined. Then, a height of the non-contacting upper portion(s) 12 can be adjusted, or the heights of all the contacting upper portions 12 can be adjusted, to ensure complete contact with the suction end 21. Therefore, it becomes simple to judge the planar relationship between the die pickup device 20 and the upper portions 12.

During the adjusting process, the supporting base 10 can be rotated at least one complete rotation, if the alerting element 32 always generates a first alert, the planar correspondence between the die pickup device 20 and the upper portions 12 is optimal.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A die bond system for bonding a die on a substrate, comprising:
    a supporting base for supporting and positioning the substrate, comprising:
        a bottom portion; and
        a plurality of conductive upper portions supported on the bottom portion, the upper portions being spaced from each other, a height of each upper portion relative to the bottom portion is adjustable;
    a die pickup device for picking up the die; and
    an alerting device, comprising
        a power source; and
        an alerting element electrically connected to the power source, two electrodes of the power source being electrically connected to the die pickup device and the upper portions, respectively, the alerting element being configured for generating alerting information according to different contacting status of the upper portions and the die pickup device;
        wherein the upper portions are electrically connected to the power source in parallel, each upper portion has a resistance different from the others, a parallel resistance of any two of the upper portions connected in parallel is different from a resistance of anyone of the other upper portions or a parallel resistance of any two or more of the other upper portions connected in parallel.

2. The die bond system of claim 1, wherein the supporting base comprises a rotating shaft for driving the bottom portion to rotate.

3. The die bond system of claim 1, wherein each upper portion comprises a screw for adjusting its height in relation to the bottom portion.

4. The die bond system of claim 1, wherein each upper portion comprises a top surface facing away from the bottom portion, and the top surfaces of the upper portions cooperatively form a supporting surface for supporting the substrate.

5. The die bond system of claim 4, wherein each upper portion is substantial a column with a fan-shaped cross-section, the supporting surface is substantially circular-shaped.

6. The die bond system of claim 1, wherein the number of the upper portions is four.

7. The die bond system of claim 1, wherein the die pickup device comprises a suction end and a connecting end opposite to the suction end, and the die pickup device defines a pumping hole passing through the suction end and the connecting end.

8. The die bond system of claim 1, wherein the die pickup device is made from tungsten steel.

9. The die bond system of claim 1, wherein the alerting element is a buzzer.

10. The die bond system of claim 1, wherein the alerting device comprises a switch unit for switching an alerting function of the alerting element.

11. The die bond system of claim 10, wherein the switch unit is electrically connected between the power source and the die pickup device.

12. A die bond system for bonding a die on a substrate comprising:
    a supporting base for supporting and positioning the substrate comprising:
        a bottom portion; and
        a plurality of conductive upper portions, each upper portion comprises a top surface facing away from the bottom portion, each upper portion is substantial a column with a fan-shaped cross-section, the supporting surface is substantially circular-shaped and the top surfaces of the upper portions cooperatively form a supporting surface for supporting the substrate, the upper portions being spaced from each other, a height of each upper portion relative to the bottom portion is adjustable;
    a die pickup device for picking up the die; and
    an alerting device comprising:
        a power source; and
        an alerting element electrically connected to the power source, two electrodes of the power source being electrically connected to the die pickup device and the upper portions, respectively, the alerting element being configured for generating alerting information according to different contacting status of the upper portions and the die pickup device.

13. The die bond system of claim 12, wherein the supporting base comprises a rotating shaft for driving the bottom portion to rotate.

14. The die bond system of claim 12, wherein each upper portion comprises a screw for adjusting its height in relation to the bottom portion.

15. The die bond system of claim 12, wherein the number of the upper portions is four.

16. The die bond system of claim 12, wherein the upper portions are electrically connected to the power source in parallel, each upper portion has a resistance different from the others, a parallel resistance of any two of the upper portions connected in parallel is different from a resistance of anyone of the other upper portions or a parallel resistance of any two or more of the other upper portions connected in parallel.

17. The die bond system of claim 12, wherein the die pickup device comprises a suction end and a connecting end opposite to the suction end, and the die pickup device defines a pumping hole passing through the suction end and the connecting end.

18. The die bond system of claim 12, wherein the alerting device comprises a switch unit for switching an alerting function of the alerting element.

19. The die bond system of claim 18, wherein the switch unit is electrically connected between the power source and the die pickup device.

* * * * *